Oct. 27, 1964 O. RUSY 3,154,753

CRYSTAL-STABILIZED OSCILLATOR OF WHICH THE FREQUENCY CAN BE MODULATED

Filed Nov. 22, 1960 2 Sheets-Sheet 1 b c

INVENTOR
OTTO RUSY

BY Frank R. Jifani
AGENT

Oct. 27, 1964 O. RUSY 3,154,753

CRYSTAL-STABILIZED OSCILLATOR OF WHICH THE FREQUENCY CAN BE MODULATED

Filed Nov. 22, 1960 2 Sheets-Sheet 2

INVENTOR
OTTO RUSY

BY Frank R. Jifari
AGENT

United States Patent Office 3,154,753

Patented Oct. 27, 1964

3,154,753

CRYSTAL-STABILIZED OSCILLATOR OF WHICH THE FREQUENCY CAN BE MODULATED

Otto Rusy, Aumuhle, Germany, assignor to North American Philips Company, Inc., New York, N.Y., a corporation of Delaware Filed Nov. 22, 1960, Ser. No. 70,944
Claims priority, application Germany Dec. 30, 1959
6 Claims. (Cl. 332—26)

In multichannel frequency-modulation transmission systems use is often made of a crystal reference system for frequency stabilization, both for the transmitter and the receiver. Both in the transmitter and in the receiver provision is then made of a freely oscillating oscillator. The frequency of the oscillator is accurately tuned by phase comparison with the frequency produced by the crystal reference system. In the transmitter the frequency modulation is also provided. This may be achieved in known manner by phase modulation and multiplication. A disadvantage of such a system, however, is the risk of many sideband frequencies.

It is furthermore known to connect a reactance valve in parallel with a crystal-stabilized oscillator to control the oscillator frequency. In this type of system, however, fairly high non-linear harmonic distortion factors of the modulation are unavoidable, particularly with fairly high sweeps, or the stabilizing effect of the crystal circuit is reduced to an extent such that the desired frequency stability is no longer ensured.

There are furthermore known frequency-modulation oscillators, in which by means of a conductor portion or of an electric network of which the electrical properties correspond with those of a λ¼ conductor or multiples thereof the series reasonance of a piezo-electrical crystal is inversely transformed and is utilised in common with a controllable susceptance and a negative resistor to produce the oscillations and the stabilization thereof.

Oscillators constructed in accordance with this principle exhibit, however, a few disadvantages, which render their technical use very difficult. The medium frequency stability of such an oscillator may not be sufficient for the requirements inherent, for example, in displaceable and portable radio telephony sets of a permissible deviation of $2.5\times10^{-5}$ in the total temperature range to be fulfilled. Moreover, a variation of the controllable susceptance is partially required, which variation cannot be obtained technically.

The invention relates to a crystal-stabilized oscillator of which the frequency can be modulated and which has coupled with it a crystal for stabilization, which provides a very high frequency stability with a very low distortion factor in the case of high sweeps. The invention is characterized by a coupling network between the crystal and the oscillator, while the impedance of the resonant circuit connected in parallel with the crystal is chosen at a maximum and the coupling between the circuits is adjusted critically or under-critically in order to avoid equivocal oscillation conditions. The circuit connected in parallel with the crystal is damped by a resistor which is not lower than the apparent series resistance of the crystal at the oscillator frequency *fo+or*—the frequency swing Δ*f*.

The coupling network is proportioned so that the stabilizing influence of the crystal with a given controllability of the susceptance and a predetermined modulation sweep is utilized to the optimum extent. The impedance of the circuit facing the negative resistor (transistor oscillator) is advantageously fixed in accordance with the technical data of the arrangement. Since, however, a high stabilizing effect of the crystal requires an optimum fixed coupling, the damping resistor is chosen so low that the statically recorded modulation characteristic curve does not exhibit the shape of an S.

A preferred embodiment of the invention is obtained by means of a transistor oscillator.

The drawing shows various embodiments:

Together with the required circuit elements, the transistor oscillator 1 (FIG. 1) forms a dipole impendance with a negative and real input resistance. This dipole, together with the frequency-determining dipole impedance 2 of FIG. 3 oscillates at the predetermined frequency.

According to the well-known four-pole theory for small signals, the following linear relations exist between the network currents and voltages:

$$I_1=y_{11}U_1+y_{12}U_2$$

$$I_2=y_{21}U_1+y_{22}U_2$$

wherein $I_1$ is the input current, $I_2$ is the output current, $U_1$ is the input voltage, $U_2$ is the output voltage, $y_{11}$ is the input conductance with the output short-circuited, $y_{22}$ is the output conductance with the input short-circuited, and $y_{12}$ and $y_{21}$ are the transfer conductances.

Figure 1:
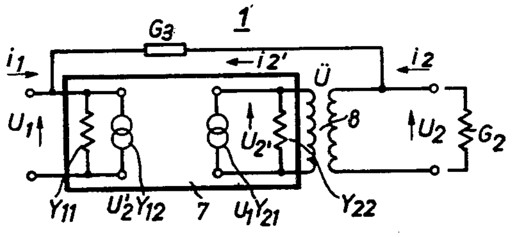
FIG. 1 is an equivalent circuit diagram of the transistor oscillator.

In the equivalent circuit of FIG. 1, the transistor consists of an input circuit with an equivalent generator $U_2'Y_{12}$ in parrallel with an admittance $Y_{11}$, and an output circuit with an equivalent generator $U_1Y_{21}$ in parallel with an admittance $Y_{22}$. $U_2'$ is the voltage at the output circuit of the transistor, and $Y_{12}$ and $Y_{21}$ are transfer admittances. A transformer U connected to the output circuit of the transistor has a transformation ratio of *u*, and an admittance $G_3$ is connected between the input and output of the network.

In the circuit of FIG. 1, the four-pole coefficients become:

$$Y_{11}=Y_{11}+G_3$$

$$Y_{12}=\frac{Y_{12}}{u}-G_3$$

$$Y_{21}=\frac{Y_{21}}{u}-G_3$$

$$Y_{22}=\left(\frac{1}{u}\right)^2Y_{22}+G_3$$

Thus, in the circuit of FIG. 1:

$$I_1=(Y_{11}+G_3)U_1+\left(\left(\frac{1}{u}\right)Y_{12}+G_3\right)U_2$$

$$I_2=\left(\frac{1}{u}Y_{21}-G_3\right)U_1+\left(\left(\frac{1}{u}\right)^2Y_{22}+G_3\right)U_2$$

Further, according to four-pole theory of the input conductance $Y_1$ is equal to:

$$Y_1=y_{11}-\frac{y_{12}y_{21}}{Y_{22}'}$$

wherein $Y_{22}'=y_{22}+G_2$, and $G_2$ is an admittance connected to the output of the transformer.

In the circuit of FIG. 1, $y_{12}$ and $y_{21}$ are determined by the transistor and the admittance $G_3$. However, since $Y_{22}'$ is determined in part by the admittance $G_2$, it is possible to adjust the admittance of $G_2$ so that the phase angle of $Y_{22}'$ is the same as the phase angle to the product $y^{12}y^{21}$. Thus, the quantity $$\frac{y_{12}y_{21}}{Y_{22}'}$$

may be real.

The input conductance of the network may assume negative values if $$\frac{y_{12}y_{21}}{Y_{22}'} > Y_{11}$$

The crystal 3 (FIG. 3) operates in series resonance; the circuits 4 and 5 are adjusted each to parallel resonance, when the circuits 5 and 4 respectively are short-circuited.

Figure 2:
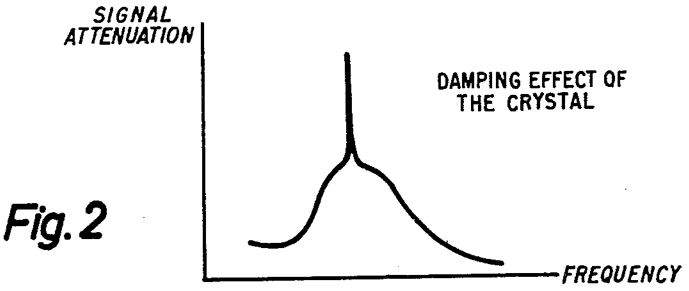
FIG. 2 is a curve illustrating the characteristics of the band-pass filter with the crystal in the secondary circuit.

When a pair of circuits resonant at the same frequency are coupled together by a capacitor, the equivalent circuit of one of the resonant circuits contains an equivalent resistance approximately proportional to the reciprocal of the product of the coupling capacitor and the resistance of the other resonant circuit. Thus, in FIG. 3, an effective resistance approximately proportional to the reciprocal of the product of capacitor 6 and the resistance of circuit 4 is coupled to resonant circuit 5. If the crystal is tuned to series resonance, the circuit 4 will be highly damped, and the resultant low resistance of circuit 4 will be coupled to the circuit 5 as a high resistance. Consequently, the circuit 5 will not be greatly damped by circuit 4. For frequencies differing from the series resonant frequency of the crystal, however, the crystal will have a higher impedance and thus won't damp the circuit 4 to as great an extent. The effective resistance of the circuit 4 will thus be increased, and due to the impedance inverting effect of the coupling to circuit 5, the damping of circuit 5 will be increased. FIG. 2 illustrates the resultant damping of the circuit 5 as a function of frequency. From this curve it is seen that the crystal effects a sharp characteristic in the region of the series resonant frequency of the crystal.

Figure 3:
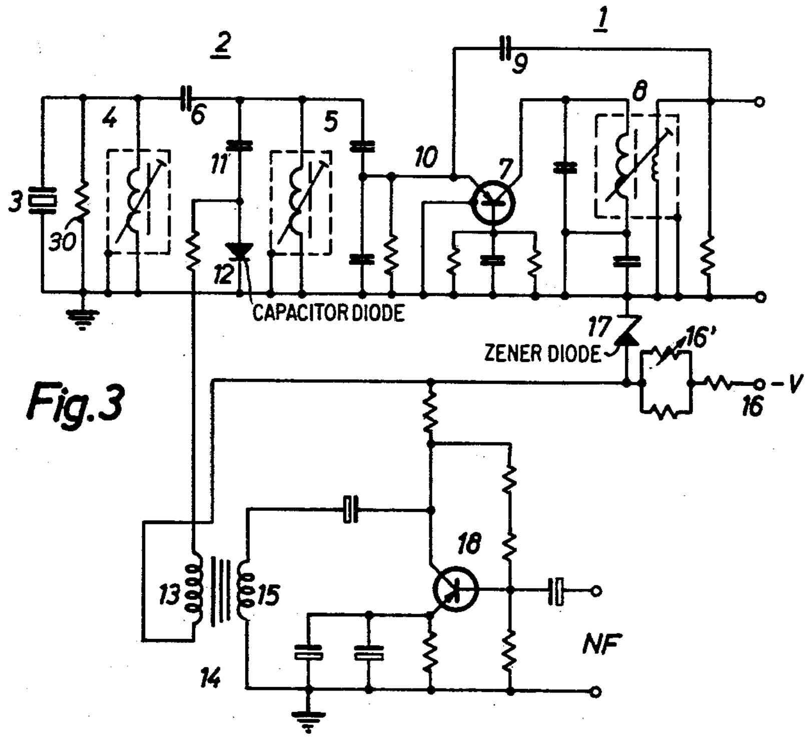
FIG. 3 shows the complete circuit of an oscillator according to the invention.

As shown in FIG. 3 the oscillator 1 consists of a high-frequency transistor 7 in common base connection. The collector circuit of transistor 7 includes a transfer member such as transformer 8. The feed-back to the emitter 10 is obtained by way of a capacitor 9. A circuit 5 is connected to the emitter, and circuit 5 is coupled via the capacitor 6 with the circuit 4. The circuit 4 includes a crystal 3. The clamping resistor 30 is connected in parallel with the crystal. The series combination of a capacitor 11 and a voltage-dependent capacitor diode 12 is connected in parallel with the coil of circuit 5. One end of the secondary winding 13 of a transformer 14 is connected to the junction between capacitors 11 and 12, whereas the other end of winding 13 is connected to the ungrounded terminal of a supply voltage source via a resistor combination 16 with a temperature-dependent resistor 16'. The supply voltage is stabilized by a Zener diode 17.

The primary winding 15 of the transformer 14 is included in the collector circuit of an amplifying transistor 18, which serves to amplify the low frequency or the modulation voltage fed to the base thereof from a source NF.

With the transistor oscillator according to the invention the frequency is determined by a dipole impedance of circuit 2. The variation of the apparent resistance of the dipole in the case of parallel resonance is derived from the series resonance of the crystal. Therefore the resonance variation is steeper than that of a normal resonant circuit, but not so steep as that of a crystal, so that, for example, by the control of a capacitor, a frequency modulation of about ±15 kc./s. is obtainable without the need for additional control means. Moreover, the novel oscillator may be used for automatic frequency correction.

The network constituting the dipole impedance may be constructed, in accordance with a further aspect of the invention, as a crystal frequency discriminator so that a voltage proportional to the obtained frequency value may be obtained from two additional terminals. This voltage may be used to indicate and/or correct the obtained frequency value. If desired, the modulation may also be obtained at these additional terminals for checking purposes.

Figure 4A:
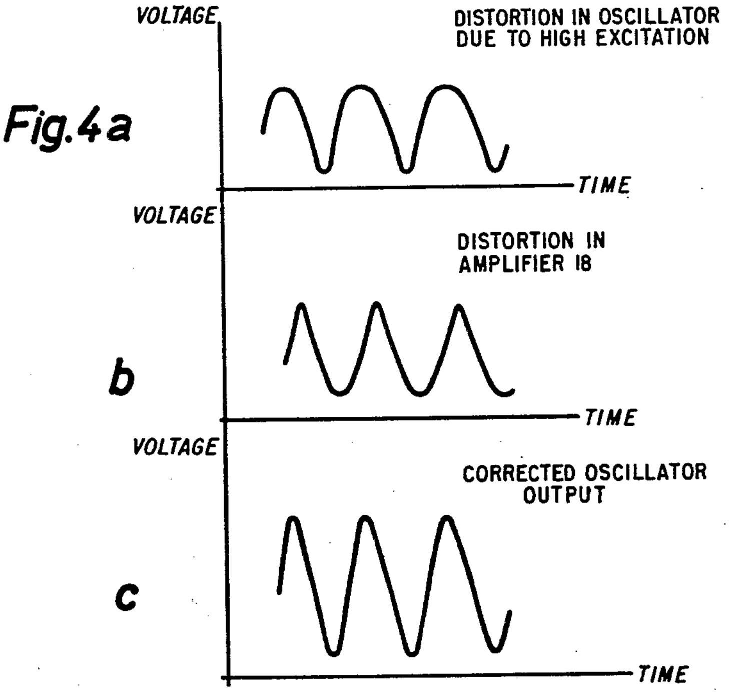
FIG. 4 shows voltage diagrams of the oscillator of FIG. 3.
Figure 5:
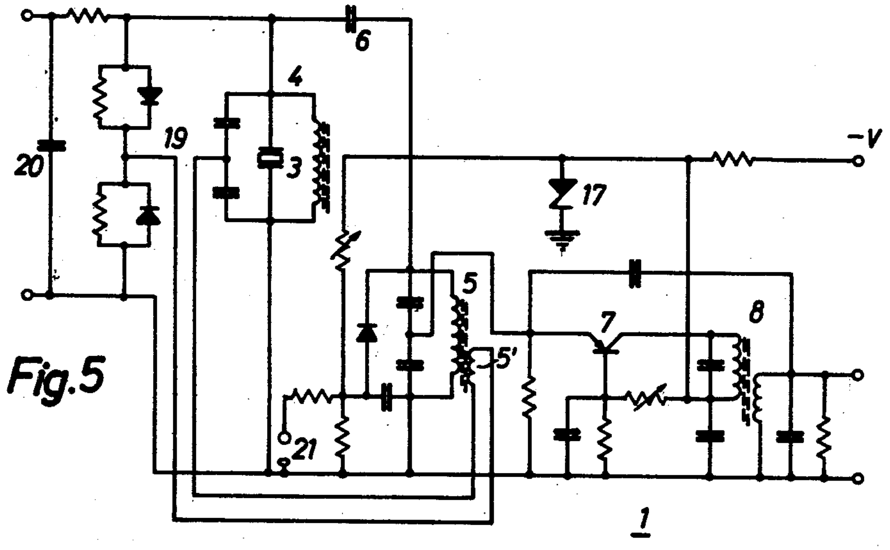
FIG. 5 shows an oscillator of a discriminator.

The deformation of the curve of the oscillator 1 due to too high excitation, as shown in FIG. 4a, is corrected to a great extent by the inverse characteristic curve of the transistor amplifier 18, see FIG. 4b, so that a substantially undistorted voltage, see FIG. 4c, is obtained, which can be obtained from 20 also by a phase discriminator 19 as shown in FIG. 5. To this end it is moreover necessary to derive a voltage from the circuit coil 5 by means of the winding 5', of which voltage the phase is to be shifted through 90° in the case of resonance. The modulation voltage may be fed to the terminals 21, after it has been amplified in the manner described above. The further circuit elements of the arrangement shown in FIG. 5 correspond with those of FIG. 3.

If it is desired, for example, that with an increasing frequency the voltage at the output of the discriminator at 20 should increase to positive values, this may be readily achieved by reversing the polarity of the connecting winding 5'.

What is claimed is:

1. A frequency modulated crystal stabilized oscillator comprising negative resistance means, and a frequency determining circuit, said frequency determining circuit comprising first and second parallel resonant circuits, means coupling said first resonant circuit to said negative resistance means, means for coupling together said first and second parallel resonant circuits with a coupling factor no greater than critical coupling, resistance damping means connected in parallel with said second resonant circuit, a series resonant crystal connected in parallel with said second resonant circuit, and means for varying the natural frequency of said first parallel resonant circuit.

2. A frequency modulated crystal stabilized oscillator comprising an oscillator having a parallel resonant frequency determining circuit, a frequency dependent circuit comprising a parallel combination of a series resonant crystal, a resistor, and reactance means, means for coupling said frequency dependent circuit in parallel with said resonant circuit, said coupling means having a coupling factor that is no greater than critical coupling, whereby said resonant circuit is damped substantially inversely to the effective resistance of said frequency dependent circuit, and means for varying the natural frequency of said parallel resonant circuit.

3. A frequency modulated crystal stabilized oscillator comprising an oscillator having a parallel resonant frequency determining circuit, a frequency dependent circuit comprising the parallel combination of a series resonant crystal, a resistor, and reactance means, capacitor means connected to couple said frequency dependent circuit in parallel with said resonant circuit, the coupling of said frequency dependent circuit to said resonant circuit being no greater than critical coupling, whereby said resonant circuit is damped substantially inversely to the product of the capacitance of said capacitor means and the effective resistance of said frequency dependent circuit, and means for varying the natural resonant frequency of said parallel resonant circuit.

4. The oscillator of claim 3 in which said means for varying said natural resonant frequency comprises a voltage dependent capacitor, means for connecting said capacitor in parallel with said resonant circuit, a source of a modulating voltage, and means for applying said voltage to said capacitor.

5. A frequency modulated crystal stabilized oscillator comprising a transistor having emitter, base, and collector electrodes, output circuit means connected between said collector and base electrodes, feedback means connected between said collector and emitter means, a parallel resonant circuit, means coupling said resonant circuit between said emitter and base electrodes, a frequency dependent circuit comprising the parallel combination of a series resonant crystal, resistance means and reactance means, capacitor means connected to couple said frequency dependent circuit in parallel with said resonant circuit, whereby said resonant circuit is damped substantially inversely to the effective resistance of said frequency dependent circuit, the coupling of said frequency dependent circuit to said resonant circuit being no greater than critical coupling, and modulator means for varying the natural resonant frequency of said parallel resonant circuit.

6. The oscillator of claim 5 comprising frequency discriminator means connected in parallel with said crystal, and phase shift means for applying a 90° phase shifted voltage from said resonant circuit to said frequency discriminator means.

References Cited in the file of this patent

UNITED STATES PATENTS

| | | |
|---|---|---|
| 2,906,969 | Rosen et al. | Sept. 29, 1959 |
| 2,925,561 | MacDonald | Feb. 16, 1960 |